United States Patent
Ottens et al.

(10) Patent No.: US 8,994,917 B2
(45) Date of Patent: Mar. 31, 2015

(54) TEMPERATURE STABILIZATION SYSTEM TO STABILIZE A TEMPERATURE OF AN ARTICLE

(75) Inventors: Joost Jeroen Ottens, Veldhoven (NL); Johannes Henricus Wilhelmus Jacobs, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 693 days.

(21) Appl. No.: 12/999,512

(22) PCT Filed: Jul. 22, 2009

(86) PCT No.: PCT/EP2009/059413
§ 371 (c)(1),
(2), (4) Date: Dec. 16, 2010

(87) PCT Pub. No.: WO2010/015511
PCT Pub. Date: Feb. 11, 2010

(65) Prior Publication Data
US 2011/0128517 A1    Jun. 2, 2011

Related U.S. Application Data

(60) Provisional application No. 61/136,046, filed on Aug. 8, 2008.

(51) Int. Cl.
G03B 27/52    (2006.01)
G03B 27/58    (2006.01)
G03B 27/32    (2006.01)
G03F 7/20    (2006.01)
H01L 21/67    (2006.01)

(52) U.S. Cl.
CPC ...... G03F 7/70875 (2013.01); H01L 21/67248 (2013.01); H01L 21/67109 (2013.01)

USPC .................................. 355/30; 355/72; 355/77

(58) Field of Classification Search
None
See application file for complete search history.

(56) References Cited

U.S. PATENT DOCUMENTS

| 5,413,167 A | 5/1995 | Hara et al. |
| 6,666,949 B1 | 12/2003 | Hillman et al. |
| 7,652,746 B2 | 1/2010 | Jacobs et al. |

(Continued)

FOREIGN PATENT DOCUMENTS

| CN | 1885171 A | 12/2006 |
| EP | 1 521 121 A | 4/2005 |

(Continued)

OTHER PUBLICATIONS

International Search Report as issued for PCT/EP2009/059413, dated Nov. 6, 2009.

*Primary Examiner* — Peter B Kim
*Assistant Examiner* — Michelle Iacoletti
(74) *Attorney, Agent, or Firm* — Pillsbury Winthrop Shaw Pittman LLP

(57) ABSTRACT

An article support is constructed to support an article. The article support includes a back fill structure constructed to supply and extract a thermal buffering fluid to and from the article support. The back fill structure is connected to an extraction duct that is constructed and arranged to extract at least a gas phase of the thermal buffering fluid from the back fill structure. The back fill structure is connected to a supply duct, constructed and arranged to supply a liquid phase of the thermal buffering fluid to the back fill structure. The back fill structure is arranged to have the thermal buffering fluid brought in a combined liquid and gas phase to thermally connect with the article.

15 Claims, 3 Drawing Sheets

(56) References Cited

U.S. PATENT DOCUMENTS

| | | | |
|---|---|---|---|
| 2002/0088220 A1* | 7/2002 | Weigl | 60/286 |
| 2005/0092013 A1 | 5/2005 | Emoto | |
| 2005/0122503 A1* | 6/2005 | Ottens et al. | 355/72 |
| 2006/0096951 A1 | 5/2006 | Natzle et al. | |
| 2006/0274298 A1* | 12/2006 | Akaike | 355/72 |
| 2007/0068922 A1 | 3/2007 | Westfield et al. | |
| 2007/0081295 A1* | 4/2007 | Brillhart et al. | 361/234 |
| 2008/0248340 A1* | 10/2008 | Fukuma et al. | 429/13 |

FOREIGN PATENT DOCUMENTS

| | | |
|---|---|---|
| EP | 1 736 831 A | 12/2006 |
| GB | 2352508 | 1/2001 |
| JP | 11-283919 | 10/1999 |
| JP | 2001-85324 | 3/2001 |
| JP | 2005-109375 | 4/2005 |
| JP | 2007-5795 | 1/2007 |
| JP | 2007-27632 | 2/2007 |
| JP | 2007-317828 | 12/2007 |
| WO | 2008/013443 | 1/2008 |

\* cited by examiner

TEMPERATURE STABILIZATION SYSTEM TO STABILIZE A TEMPERATURE OF AN ARTICLE

CROSS-REFERENCE TO RELATED APPLICATIONS

This application is the National Phase entry of PCT/EP2009/059413, which claims the benefit of US provisional application 61/136,046, which was filed on 8$^{th}$ Aug. 2008, and which is incorporated herein in its entirety by reference.

FIELD

The present invention relates to a temperature stabilization system constructed to stabilize a temperature of an article, such as a wafer or a patterning device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the conventional lithographic projection apparatus, during photolithographic processes, an article, such as a wafer or reticle is clamped on an article support by a clamping force, that may range from vacuum pressure forces, electrostatic forces, intermolecular binding forces or just gravity force. The article support defines a plane, on which the wafer or reticle is held. During the lithographic process, temperature effects may affect image resolution due to a limited focal distance of the projection system. Therefore the article support should ideally be flat.

In the context of this application, the said "article" may be any of the above mentioned terms wafer, reticle, mask, or substrate, more specifically terms such as a substrate to be processed in manufacturing devices employing lithographic projection techniques; or a lithographic projection mask or mask blank in a lithographic projection apparatus, a mask handling apparatus such as mask inspection or cleaning apparatus, or a mask manufacturing apparatus or any other article or optical element that is clamped in the light path of the radiation system.

Conventionally, the article supports are known to be provided with a backfill gas structure in order to enhance the thermal conductivity between the substrate and the article support. However, with increasing irradiation energy levels, the need for thermal conditioning is increasingly difficult to meet.

SUMMARY

Embodiments of the present invention aim to provide a thermal conditioning system with improved conditioning characteristics.

In accordance with an embodiment of the invention, there is provided a temperature stabilization system constructed to stabilize a temperature of an article. The system includes an article support constructed to support the article when mounted in an article support position, a back fill structure constructed and arranged to supply a buffering fluid to make thermal contact with the article and to extract the buffering fluid from thermal contact with the article, an extraction duct constructed and arranged to extract at least the thermal buffering fluid from the back fill structure in at least a gas phase, and a supply duct constructed and arranged to supply the thermal buffering fluid in at least a liquid phase. The back fill structure is arranged to have the thermal buffering fluid brought in a combined liquid and gas phase when establishing thermal contact between the buffering fluid and the article.

The article may be a substrate, especially a wafer. Alternatively, the article may be a patterning device.

The back fill structure may comprise a plurality of supporting protrusions providing a flat plane of support; and a boundary wall defining a boundary wall height that lies below said plane of support.

At least part of the extraction duct may be located at a distance above the channel structure bottom. Alternatively or in addition to this, at least part of the extraction duct is located in the channel structure bottom.

The backfill structure may be constructed and arranged to supply the buffering fluid to make thermal contact with the article at a gas backfill pressure. The gas backfill pressure may typically range from 1-30 mbar.

In accordance with an embodiment of the invention, there is provided a temperature control method for controlling an article temperature in an irradiation process. The article is clamped on an article support. The method includes measuring a thermodynamic characteristic of a thermal buffering fluid provided in a back fill structure arranged in the article support; and extracting gas phase buffering fluid from the back fill structure and/or supplying liquid phase buffering fluid in connection with the measured thermodynamic characteristic to control the article temperature through evaporation of the buffering fluid.

In accordance with an embodiment of the invention, there is provided a lithographic apparatus that includes an illumination system configured to condition a radiation beam, and a patterning device support constructed to support a patterning device. The patterning device is capable of imparting the radiation beam with a pattern in its cross-section to form a patterned radiation beam. The apparatus includes a projection system configured to project the patterned radiation beam onto a target portion of a substrate, and a temperature stabilization system constructed to stabilize a temperature of an article. The temperature stabilization system includes an article support constructed to support the article when mounted in an article support position, a back fill structure constructed and arranged to supply a buffering fluid to make thermal contact with the article and to extract the buffering fluid from thermal contact with the article, an extraction duct constructed and arranged to extract at least the thermal buffering fluid from the back fill structure in at least a gas phase, and a supply duct constructed and arranged to supply the thermal buffering fluid in at least a liquid phase. The back fill structure is arranged to have the thermal buffering fluid brought in a combined liquid and gas phase when establishing thermal contact between the buffering fluid and the article.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
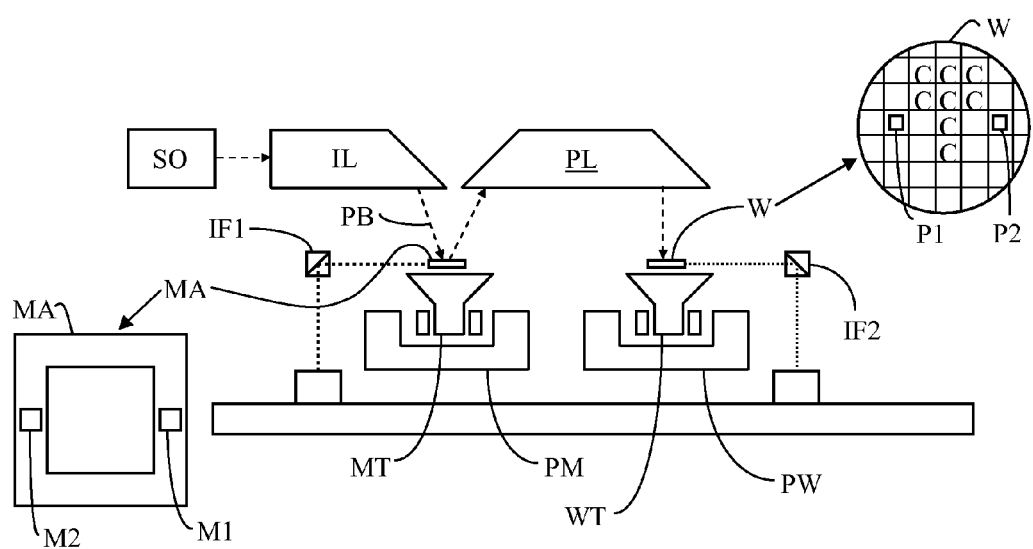
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam PB (e.g. UV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as s-outer and s-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
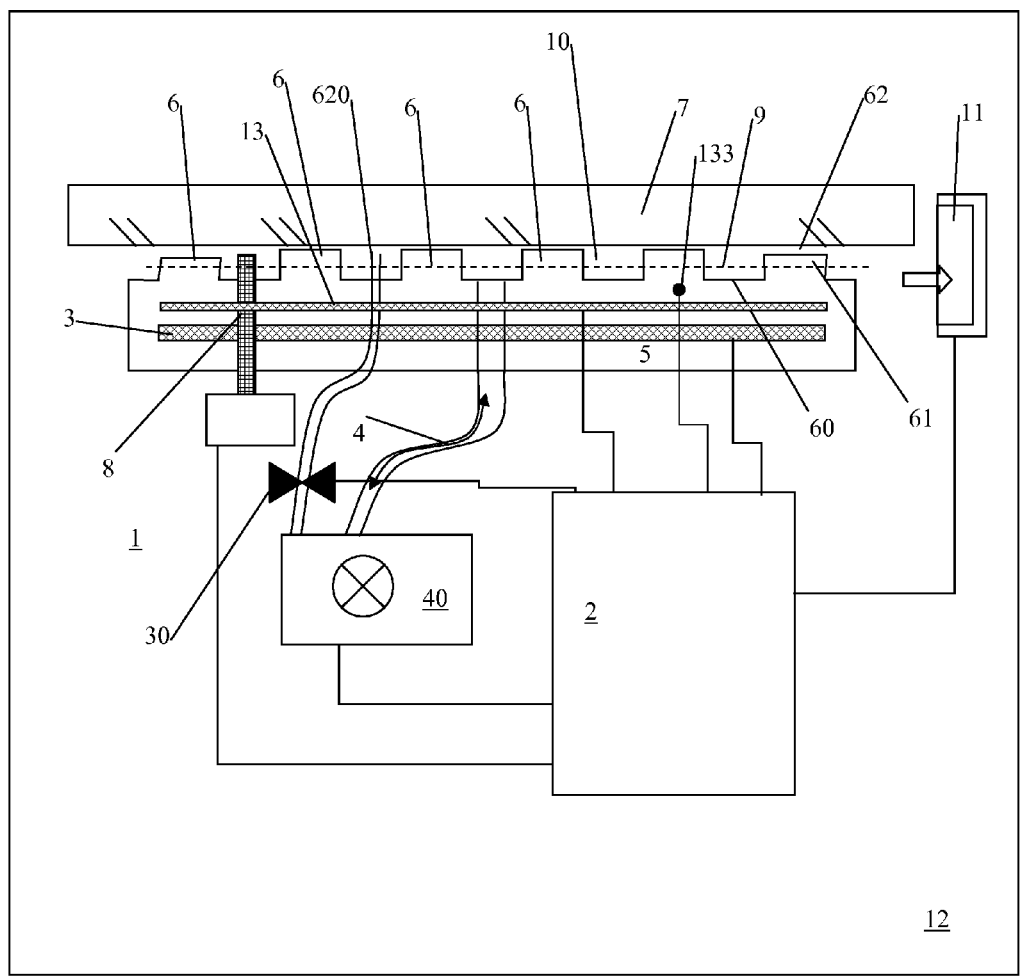
FIG. 2 shows a schematic embodiment of the lithographic apparatus comprising a controller according to an embodiment of the invention.

FIG. 2 illustrates schematically the temperature stabilization system 1 according to the invention, where the system 1 comprises a controller 2 configured to control an electrostatic clamp 3 and/or the backfill supply system 40. The controller 2 may be a software part that is embodied in the controlling logic of the lithographic apparatus or it may be a separate controlling function or embodied in a general controlling program for controlling the process functions of the lithographic apparatus. Otherwise, it may be embodied in hardware, such a digital and/or analog circuit that is arranged to provide the controlling functions via circuitry that will not be elaborated upon since the design thereof may be implemented without burden when reading the disclosure of this application. As is illustrated with reference to FIG. 2, the clamp 3 may form part of an article support 5, which is illustrated to have a plurality of protrusions 6 such as is described with reference to European Patent Application Publication No. 0947884. Thus, in this example, a back fill structure 10 is formed by the plurality of supporting protrusions 6 providing a flat plane of support. Additionally, a boundary wall 61 may be provided defining a boundary wall height that lies below said plane of support. The boundary wall 61 functions to confine the buffering fluid in the liquid phase, and in addition to the substantial confinement, the boundary wall 61 is configured to allow a small leakage of the backfill gas phase. It is noted that although in this embodiment, protrusions 6 are provided to form the backfill structure 10, other containment structures, including channels, troughs or cavities may serve to provide a backfill structure.

The protrusions 6 provide an ultra flat plane of support, so that during the photolithographic process, an article 7 may be kept level in the most optimal way. In FIG. 2, the article is a substrate 7, more specifically a wafer 7. To keep the substrate 7 stable to the article support 5, the clamp 3 provides a clamping force, that is, the substrate 7 is pressed onto the article support 5, for instance, by electrostatic clamping or other clamping methods known in the art. To this end, it should be clear that the invention equally applies to a general flat article to be placed in a projection beam, such as an optical element such as a (reflective or transmissive) reticle, or to a substrate to be irradiated, such as a wafer.

In the photolithographic process, a backfill fluid is supplied in liquid form to a backfill structure 10 between the substrate 7 and the article support 5. The liquid partly evaporates to form a combined gas phase/liquid phase. In this phase, the temperature is kept stable due to the evaporation heat. In this way, thermal contact between the substrate 7 and the article support 5 may be improved with temperature balance. Furthermore, in this embodiment, an extraction duct 62 is formed by a gap above the boundary wall 61, so that the gas phase of the thermal buffering fluid flows into the vacuum compartment 12 enclosing the article support 5. However, other embodiments may comprise an exhaust structure provided on the article support, for example by piping or the like, constructed and arranged to extract at least a gas phase of the thermal buffering fluid from the back fill structure 10. In an embodiment, the gas phase extraction duct 62 is arranged at a distance above the channel structure bottom, so as to be free from thermal buffering fluid in the liquid phase.

In addition, the back fill structure 10 is connected to at least one supply duct 4, constructed and arranged to supply a liquid phase of the thermal buffering fluid to the back fill structure 10, the back fill structure arranged to have the thermal buffering fluid brought in a combined liquid and gas phase, to thermally connect with the substrate 7.

Such an arrangement may be beneficial to illumination performance, since overheating of the substrate 7 may be prevented, which could result in thermal deformation or even loss. After and during the photolithographic process, the backfill gas is pumped away by a backfill gas pump 11. This pump 11 may be a separate unit for extracting the gas from the cavity 10. In addition, to unload a wafer, the liquid may be pumped away via supply/exhaust duct 4. In addition, or alternatively, the liquid may not be pumped away, but may be left, after unloading of the article, to evaporate into the compartment 12, and to be eliminated by vacuum pumping of pump 11. This could result in massive evaporation, thereby causing a significant temperature drop that could be compensated by additional heaters 13 provided in or near the article support.

A pressure sensor 8 is constructed to detect a gas pressure in the back fill structure 10. According to an embodiment of the invention, the controller 2 may be arranged to supply liquid phase from supply system 40 below a predetermined lower pressure value and or increase the gas flow resistance via valve 30 and or increase the heater power via heaters 13; and to extract gas phase above a predetermined higher pressure value and or reduce the gas flow resistance and or decrease the heater power. Thus, the controller 2 functions to control the temperature by stabilizing the backfill gas pressure so as to regulate the evaporation. Accordingly, the evaporation temperature is determined by the gas pressure level of the 2-phase condition.

In one aspect, the controller 2 determines an evaporation rate by measuring a heatload to the article. Conversely, a changing evaporation rate will lead to a changing pressure level at a fixed flow restriction, which leads to a temperature level variation. Accordingly, the gas flow resistance from the backfill structure may be controllable, for example, by controllable valve/piston/membrane 30 in the gas exhaust ducting 62, 620.

A differentially pumped seal between the evaporation volume and the article environment is a way to reduce the gas load to the environment, when the gas load is causing negative effects in the environment of the article.

Desirably, the pressure sensor 8 is arranged at a distance above the channel structure bottom 61, so as to be free and above the level of thermal buffering fluid in the liquid phase. To free the pressure sensor 8 from liquid, the pressure sensor may be heated slightly. Alternatively, a gas pressure can be measured near the extraction duct 62 or in the extraction duct 62; so that a pressure level in the backfill structure can be derived. The article support structure can be equipped with a temperature sensor 133 to measure the temperature of the article support 5 when there is no article 7 present. The temperature sensor 133 is connected to the controller 2 and the signal can be used to control one or more heater elements 13 on the article support 5.

As depicted in the illustrated embodiment, the liquid phase thermal buffering fluid supply 40 may comprise a two way supply/extraction duct 4 arranged in the channel structure bottom. However, other extraction ducts may be available, in addition to a plurality of supply ducts, in order to promote a fast and efficient spread of the liquid.

A porous material or a capillary system can be used to distribute the liquid over the article holder and prevent liquid vibrations while the article support is moved.

In addition to a liquid supply, an additional gas exhaust/supply line 620 may be used to rapidly fill the backfill volume 10 without having a large evaporation load already. In addition, liquid supply line 4 might need temperature conditioning to precondition the liquid to be at substrate 5 temperature level.

A feedforward control for an operational conditioning change (e.g. wafer unload) can be used to increase the control performance.

The pressure sensor 8 can be an absolute pressure sensor or a differential pressure sensor to a reference pressure. The reference pressure can for example be the environment of the article in case of a vacuum environment of which is the pressure level much smaller than the max. allowable pressure variation.

Figure 3:
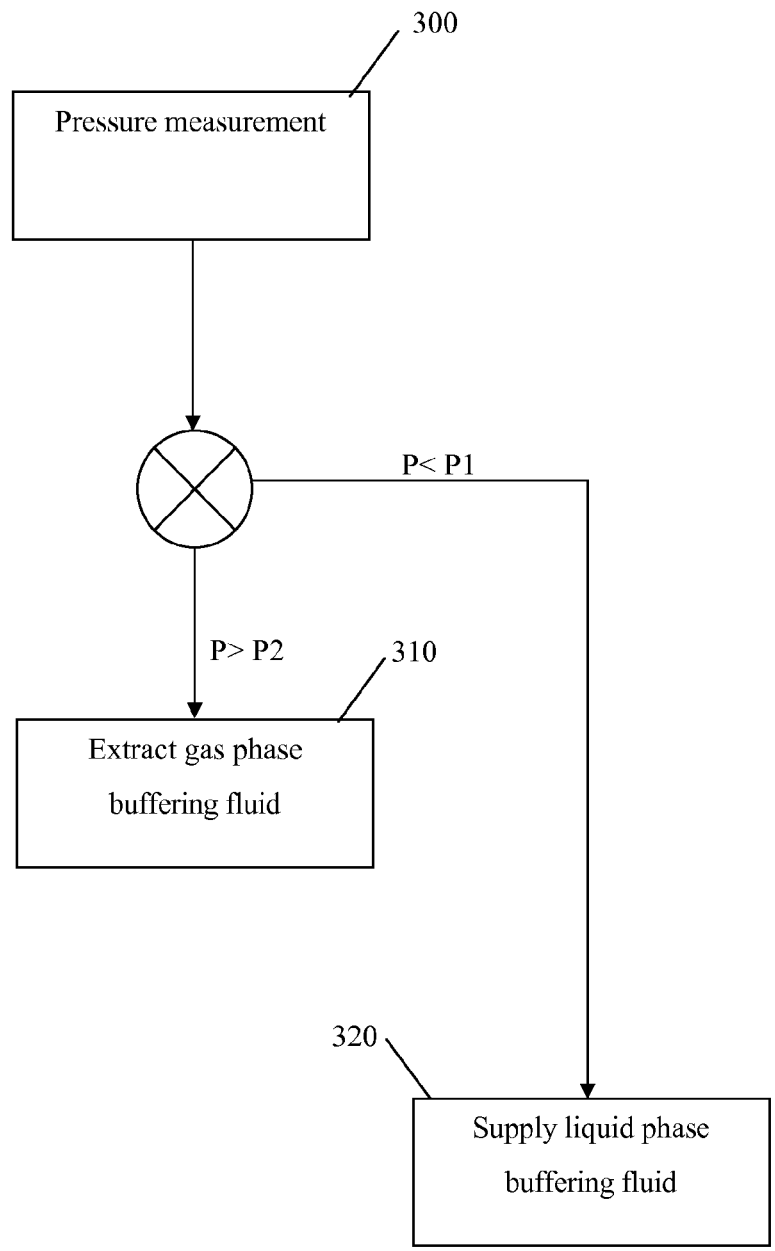
FIG. 3 shows a schematic representation of a method according to an embodiment of the invention.

FIG. 3 furthermore details and summarizes a method according an embodiment of the invention, performed in connection with the above-described embodiment wherein an article is clamped on an article support in an irradiation process.

In a first step 300, a thermodynamic characteristic, such as pressure, of a thermal buffering fluid that is provided in a back fill structure arranged in an article support is measured.

The measured gas pressure is then indicative for controlled extraction (step 310)—in case gas phase buffering fluid from the back fill structure exceeds a predetermined first threshold of a pressure P>P2, or controlled supply (step 320)—in case the pressure is below a second threshold of a pressure P<P1. Of course, first threshold pressure P1 is lower than second threshold pressure P2. Thus, the supply and/or extraction of the liquid and gas phase buffering fluid are controlled in connection with the measured thermodynamic characteristic, to control the article temperature through evaporation of the buffering fluid. Indicative pressures for P1 (the lower first threshold), may range, for water as a buffer fluid below 26.44 millibar, for instance, a threshold in the range 26.4-26.44 millibar. An indicative pressure for P2 (the higher second threshold) may range, for water as a buffer fluid, above 26.44 millibar, for instance, a threshold in the range of 26.48 millibar for a +/− 20 mK range. A person skilled in the art will appreciate that the numerical values shown here are depicted using the decimal point.

Although this method has been described in connection with a measured pressure, the skilled person will readily see that this method is also applicable to other, related thermodynamic quantities such as temperature. Accordingly, the preset backfill gas pressure level can be actively controlled in response to a measured heat load on the article support.

In this context, the term vacuum pressure is relative to particular gasses that are present in the environment. For instance, water, which has very good cooling capacity, has a saturation pressure of about 26 millibar, in the applied temperature ranges, which is in the range of conventional back fill gas pressures of 1-30 millibar. Other fluids may be acetone, ethanol or methanol or any mixtures thereof including water. Saturation pressure of ethanol range between 50-90 mbar; saturation pressure of methanol ranges between 130-160 mbar; which may be feasible backfill gas pressures.

Thus, the relative background pressure may vary in terms of the environment of the apparatus. For instance, where the article support functions in the environment of a wafer support, the vacuum requirements for certain components may be less strict than in the environment where the article support functions as a reticle support. That is, the partial pressures for contaminants may differ a factor 100 between optics compartment (including reticle support) and wafer compartment and are much lower than the total pressure (typical numbers are 1 e-9 to 1 e-12 mbar). Acceptable leak rates may vary with a boundary wall gap height to a maximum of 3.10-4 mbar*l/s for a throughput as high as 150 wafers per hour.

Although the illustrated embodiments refer to article supports to be used for supporting substrates to be targeted with a patterned beam, the structure may be very well applied for reticle supports or any other support that needs thermal stabilization.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A temperature stabilization system constructed to stabilize a temperature of an article, the system comprising:
    an article support constructed to support the article when mounted in an article support position, the article support comprising a plurality of protrusions configured to provide a flat plane of support for the article;
    a back fill structure formed by the plurality of protrusions, the back fill structure constructed and arranged to supply a buffering fluid to make direct contact with the article and to extract the buffering fluid from direct contact with the article;
    a boundary wall defining a boundary wall height that lies below the flat plane of support for the article and configured to confine the buffering fluid in a liquid phase and allow leakage of the buffering fluid in a gas phase;
    an extraction duct constructed and arranged to extract at least the buffering fluid from the back fill structure in at least the gas phase; and
    a supply duct constructed and arranged to supply the buffering fluid in at least the liquid phase,
    the back fill structure being arranged to have the buffering fluid brought in a combined liquid and gas phase when establishing thermal direct contact between the buffering fluid and the article.

2. The system according to claim 1, wherein the back fill structure comprises a channel structure at least partially defined by the plurality of protrusions, the channel having a bottom, the direct contact being established when at least part of the channel structure is filled with the liquid phase of the buffering fluid.

3. The system according to claim 2, further comprising a liquid phase fluid supply arranged to supply the buffering fluid in a liquid phase to the supply duct; a gas phase fluid extraction pump arranged to extract the buffering fluid in a gas phase from the extraction duct; a controller configured to control the liquid phase fluid supply and the gas phase fluid extraction pump; and a sensor constructed to detect a thermodynamic property in the back fill structure, the controller arranged to control the liquid phase fluid supply and/or the gas phase extraction pump depending on the thermodynamic property so as to stabilize the gas phase pressure of the buffering fluid in direct contact with the article support.

4. The system according to claim 3, wherein the sensor comprises a pressure sensor constructed to detect a gas pressure in the back fill structure, the controller arranged to control the liquid phase fluid supply to supply the buffer fluid in the liquid phase, when detected pressure is below a predetermined lower pressure value and to control the gas phase extraction pump to extract the buffer fluid in the gas phase, when the detected pressure is above a predetermined higher pressure value.

5. The system according to claim 4, wherein the pressure sensor is located at a distance above the channel structure bottom.

6. The system according to claim 4, wherein the pressure sensor is arranged with a heater to prevent liquid blocking of the pressure sensor.

7. The system according to claim 1, wherein the back fill structure comprises a porous and/or capillary system arranged to prevent liquid flow induced by article support movement.

8. The system according to claim 1, further comprising a liquid phase fluid supply arranged to supply the buffering fluid in a liquid phase to the supply duct; a gas phase fluid extraction pump arranged to the extract the buffering fluid in a gas phase from the extraction duct; a controller configured to control the liquid phase fluid supply and the gas phase fluid extraction pump; and a sensor constructed to detect a thermodynamic property in the back fill structure, the controller arranged to control the liquid phase fluid supply and/or the gas phase extraction pump depending on the thermodynamic property so as to stabilize the gas phase pressure of the buffering fluid in direct contact with the article support.

9. The system according to claim 1, wherein the article support comprises an electrostatic clamp configured to clamp the article to the article support.

10. A lithographic projection apparatus comprising:
    an illumination system configured to condition a radiation beam;
    a patterning device support constructed to support a patterning device, the patterning device being capable of imparting the radiation beam with a pattern in its cross-section to form a patterned radiation beam;
    a projection system configured to project the patterned radiation beam onto a target portion of an article; and a temperature stabilization system constructed to stabilize a temperature of an article, the system comprising an article support constructed to support the article when mounted in an article support position, the article support comprising a plurality of protrusions configured to provide a flat plane of support for the article, a back fill structure formed by the plurality of protrusions, the back fill structure constructed and arranged to supply a buffering fluid to make direct contact with the article and to extract the buffering fluid from direct contact with the article, a boundary wall defining a boundary wall height that lies below the flat plane of support for the article and configured to confine the buffering fluid in a liquid phase and allow leakage of the buffering fluid in a gas phase;

an extraction duct constructed and arranged to extract at least the buffering fluid from the back fill structure in at least the gas phase, and a supply duct constructed and arranged to supply the buffering fluid in at least the liquid phase, the back fill structure being arranged to have the buffering fluid brought in a combined liquid and gas phase when establishing direct contact between the buffering fluid and the article.

11. The lithographic projection apparatus according to claim 10, wherein the backfill structure is constructed and arranged to supply the buffering fluid to make direct contact with the article at a gas backfill pressure, wherein said gas backfill pressure ranges from 1-30 mbar.

12. The lithographic projection apparatus according to claim 10, wherein the article support comprises an electrostatic clamp configured to clamp the article to the article support.

13. A temperature control method for controlling an article temperature in an irradiation process, the article clamped on an article support; the method comprising:

measuring a thermodynamic characteristic of a buffering fluid provided in a back fill structure formed by a plurality of protrusions of the article support configured to provide a flat plane of support for the article and in direct contact with the article; and extracting gas phase buffering fluid from direct contact with the article and from the back fill structure and supplying liquid phase buffering fluid to the back fill structure in connection with the measured thermodynamic characteristic to control the article temperature through evaporation of the buffering fluid from the liquid phase to the gas phase.

14. The method according to claim 13, wherein the thermodynamic characteristic is a preset backfill gas pressure level.

15. The method according to claim 14, wherein the preset backfill gas pressure level is actively controlled in response to a measured heat load on the article support.

\* \* \* \* \*